(12) United States Patent
Merchant et al.

(10) Patent No.: US 6,686,662 B2
(45) Date of Patent: Feb. 3, 2004

(54) SEMICONDUCTOR DEVICE BARRIER LAYER

(75) Inventors: Sailesh Mansinh Merchant, Orlando, FL (US); Isaiah O. Oladeji, Singapore (SG); Seong Jin Koh, Winter Garden, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/153,231

(22) Filed: May 21, 2002

(65) Prior Publication Data
US 2003/0218256 A1 Nov. 27, 2003

(51) Int. Cl.$^7$ .......................... H01L 23/52; H01L 23/48
(52) U.S. Cl. ................. 257/751; 257/750; 257/758; 257/774
(58) Field of Search ............... 257/751, 750, 257/758, 774

(56) References Cited

U.S. PATENT DOCUMENTS

| | | | |
|---|---|---|---|
| 5,668,054 A | | 9/1997 | Sun et al. |
| 5,940,698 A | | 8/1999 | Gardner et al. |
| 6,140,231 A | | 10/2000 | Lin et al. |
| 6,268,290 B1 | * | 7/2001 | Taguchi et al. ............. 438/688 |
| 6,268,291 B1 | * | 7/2001 | Andricacos et al. ........ 438/694 |
| 6,294,836 B1 | | 9/2001 | Paranjpe et al. |
| 6,339,258 B1 | * | 1/2002 | Cooney, III et al. ........ 257/762 |
| 6,465,888 B2 | * | 10/2002 | Chooi et al. ................. 257/751 |
| 6,525,428 B1 | * | 2/2003 | Ngo et al. ................... 257/774 |
| 6,531,780 B1 | * | 3/2003 | Woo et al. ................... 257/758 |

FOREIGN PATENT DOCUMENTS

WO        WO 00/39849        7/2000

* cited by examiner

*Primary Examiner*—Jasmine Clark
(74) *Attorney, Agent, or Firm*—Robert L. Wolter, Esquire; Beusse Brownlee Wolter Mora & Maire, P.A.

(57) ABSTRACT

A barrier layer for a semiconductor device metallization component provides a silicon nitride film formed in a component recess and a refractory metal film formed over the silicon nitride film. The device component includes a dielectric material and a recess formed in the dielectric. The surface of the dielectric material within the recess is exposed to nitrogen under controlled parameters. A section of the dielectric material adjacent an interior of the recess is converted to silicon nitride.

The refractory metal is then conformed deposited along the recess sidewalls. A seed layer is then deposited over the refractory metal film, and a conductive metal is then deposited within the recess. The device is then polished to remove excess metal outside the recess and planarize the device.

19 Claims, 5 Drawing Sheets

SEMICONDUCTOR DEVICE BARRIER LAYER

This invention relates to the fabrication of semiconductor devices and, more specifically, to barrier layers used in the metallization of semiconductor device components, and passivation of dielectric materials.

BACKGROUND OF THE INVENTION

Thin films serve a variety of different functions in the manufacture of semiconductor devices. For example, thin films are used in the construction of interconnect structures. Interconnect structures are those structures on an integrated circuit device that connect different levels of a multi-level semiconductor device, and include features such as trenches and vias in which a conductive metal is deposited. Thin films are often used to form barrier layers within a feature between a dielectric material and a conductive metal.

A typical interconnect structure is shown in FIG. 1. An interconnect structure 11 includes an upper metallization layer 12 and lower metallization layer 13 separated by a dielectric layer 14 or insulating layer. The conductive metal layers 12 and 13 comprise metal lines 15 spaced apart within a dielectric material 16. Conductive metal-filled vias 17 interconnect the metal lines 15 of the upper metallization layer 12 to the conductive lines 15 of the lower metallization layer 13. Typically, in a multi-level structure, the lower metallization layer 13 is fabricated using a process known as single damascene, and the dielectric layers 14 and upper metal layers 12 are fabricated using a process known as dual damascene. These damascene processes are known to those skilled in the art.

In either damascene process, a feature, such as a trench, via or combination thereof, is etched in the dielectric material 16. A barrier layer 18 is then deposited in the feature using a known process such as sputter deposition. The barrier layer 18 forms a thin film conforming to the sidewalls and bottom of the feature. A seed layer 19 is then deposited over the barrier layer 18, and the conductive metal is electroplated in the feature over the seed layer 19. The device is planarized after these deposition steps to remove excess film and metal outside the feature. The barrier layer 18 prevents the diffusion of the conductive metal into the dielectric material, and the seed layer 19 promotes adherence of the conductive metal to the barrier layer 18. Refractory metals and/or refractory metal alloys are often used in fabrication of barrier layers. For example tantalum (Ta) and/or tantalum nitride (TaN) may be applied as a component of a barrier layer.

However, Ta is polycrystalline and diffusion of copper through the Ta grain boundaries persists. Previous attempts to solve this problem included increasing the thickness of the Ta film, adding nitrogen to the Ta to block grain boundary diffusion paths, or use a Ta/TaN dual barrier layer. Unfortunately, these options increase the resistance of the barrier layer, which adversely impacts electromigration. This is especially the case where the barrier layer 18 is deposited on the bottom of a via over the lower metallization layer 13 and line 15, as shown in FIG. 1; thereby increasing the resistance across the interconnect structure.

In addition, the Ta film does not prevent water adsorbed in the porous low-k dielectric materials from attacking the copper. Low-k dielectric materials are used in part because of their low resistivity, and include those dielectric materials having a dielectric constant less than about 4.0. Organisilicates are the most commonly used low-k dielectrics. However, low-k dielectrics are very porous, and are hygroscopic. Water captured within the porous low-k dielectric will evaporate. Water vapor can migrate to the copper, oxidizing the metal. Moreover, Ta adheres poorly to the organosilicates and other spin on low-k dielectric materials used in the fabrication of interconnect structures.

SUMMARY OF THE INVENTION

The present invention is for a barrier layer, and process for fabricating a barrier layer, that utilizes a novel dual film. The two films comprising the barrier layer are formed within a recess or feature such as a trench, via, hole etc., formed in a device topographical structure. The barrier layer includes a first film comprising silicon nitride (SiN), which is disposed along a surface of a dielectric material within the device feature. A second film, or refractory metal film, is deposited along the sidewalls and bottom of the feature and over the silicon nitride film. The term refractory metals as used in this disclosure shall also include refractory metal alloys. A metal seed layer is then deposited over the barrier layer, and the conductive metal is then deposited within the feature over the seed layer.

The present invention is described in the context of fabrication of an interconnect structure, but it is not intended to be so limited, but may be applied to any device component requiring a barrier layer for metallization and/or dielectric passivation. An interconnect structure generally includes a plurality of layers (dielectric layers) of dielectric materials deposited atop one another. These dielectric layers are separated by etch stop layers, which, in part, define boundaries of features to be etched in the dielectric materials. The dielectric materials may include low-k dielectric materials, which term as used in this disclosure include spin-on dielectrics such as organosilicates, having a dielectric constant of up to about 4.0.

A recess or feature, such as a via or trench, etched in the dielectric material has at least one or more sidewalls, which may include one or more exposed surfaces of the dielectric material. The surface of the dielectric is exposed to nitrogen at a predetermined temperature and pressure for a timed duration. The surface of the dielectric undergoes nitridation, which forms a $Si_3N_4$ film along the dielectric surface. The nitridation alters the chemical composition of a portion of the dielectric, forming a film integrated within the dielectric material and along the dielectric surface.

The refractory metal film is then deposited within the feature conforming to the sidewalls and bottom of the feature and over the silicon nitride film. A metal seed layer is deposited over the refractory metal film. The conductive metal is then deposited within the feature, and the device is planarized using chemical mechanical planarization ("CMP") to remove excess metal and films outside the device feature.

In this manner, the $Si_3N_4$ film (or first film) seals the surfaces of the dielectric material, and in combination with the refractory metal film, serves as a barrier layer to inhibit diffusion of the conductive metal to the dielectric. The $Si_3N_4$ also promotes adherence of the refractory metal to the surface of the low-k dielectric.

DETAILED DESCRIPTION OF THE DRAWINGS

The present invention described herein is illustrated in more detail in FIGS. 2 through 5, in the context of the dual damascene fabrication of an interconnect structure. However, the present invention for a novel barrier layer, and the process of fabricating a barrier layer, is not limited to the fabrication of an interconnect structure, or the particular features (via or trench) of an interconnect structure. Moreover, the invention may be applied to the single damascene construction of a metal layer, and treatment of the dielectric therein. The novel barrier layer may be used with various types of semiconductor device components and device features.

Figure 1:
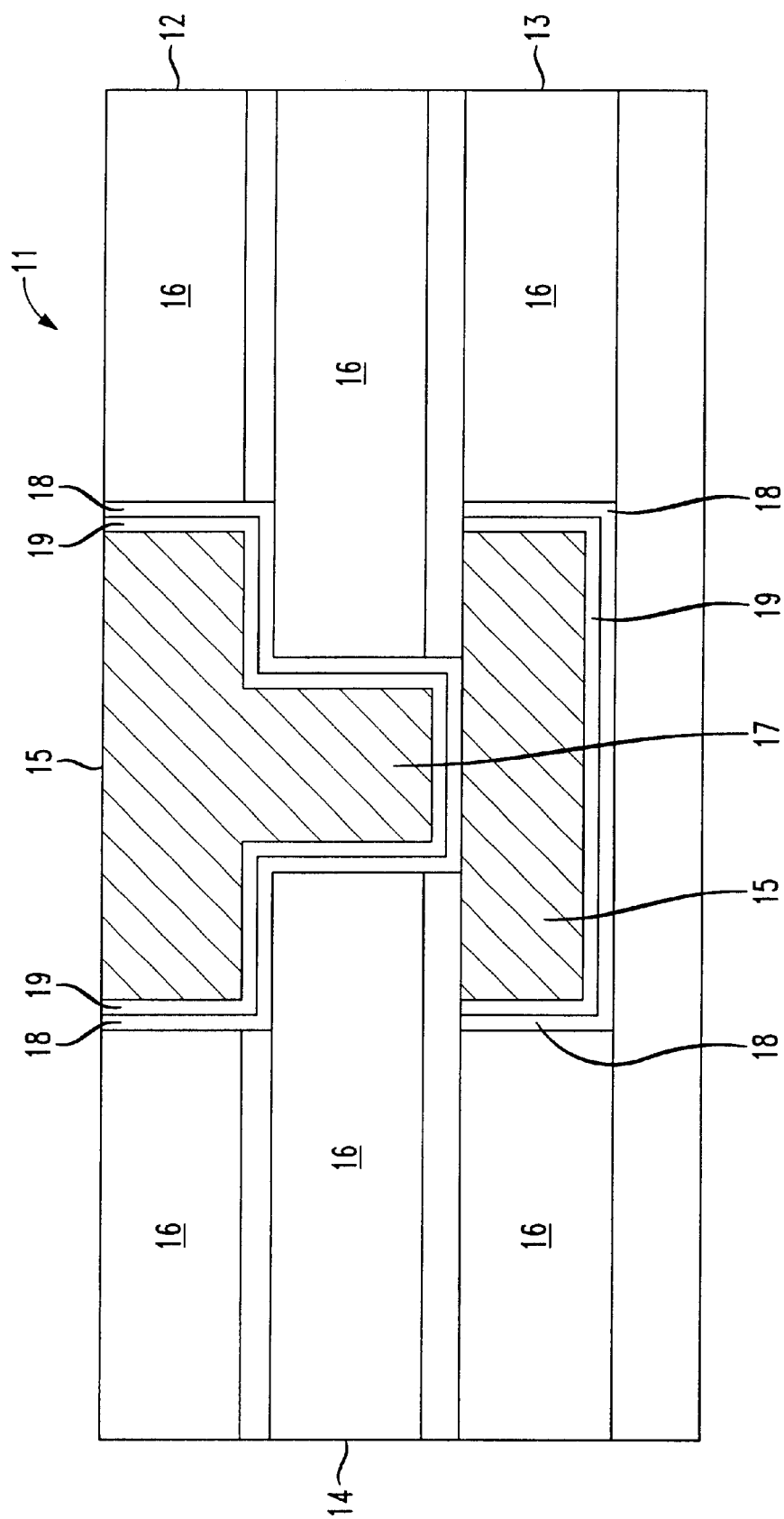
FIG. 1 is a partial sectional view of an interconnect structure on a semiconductor device with a prior art barrier layer.
Figure 2:
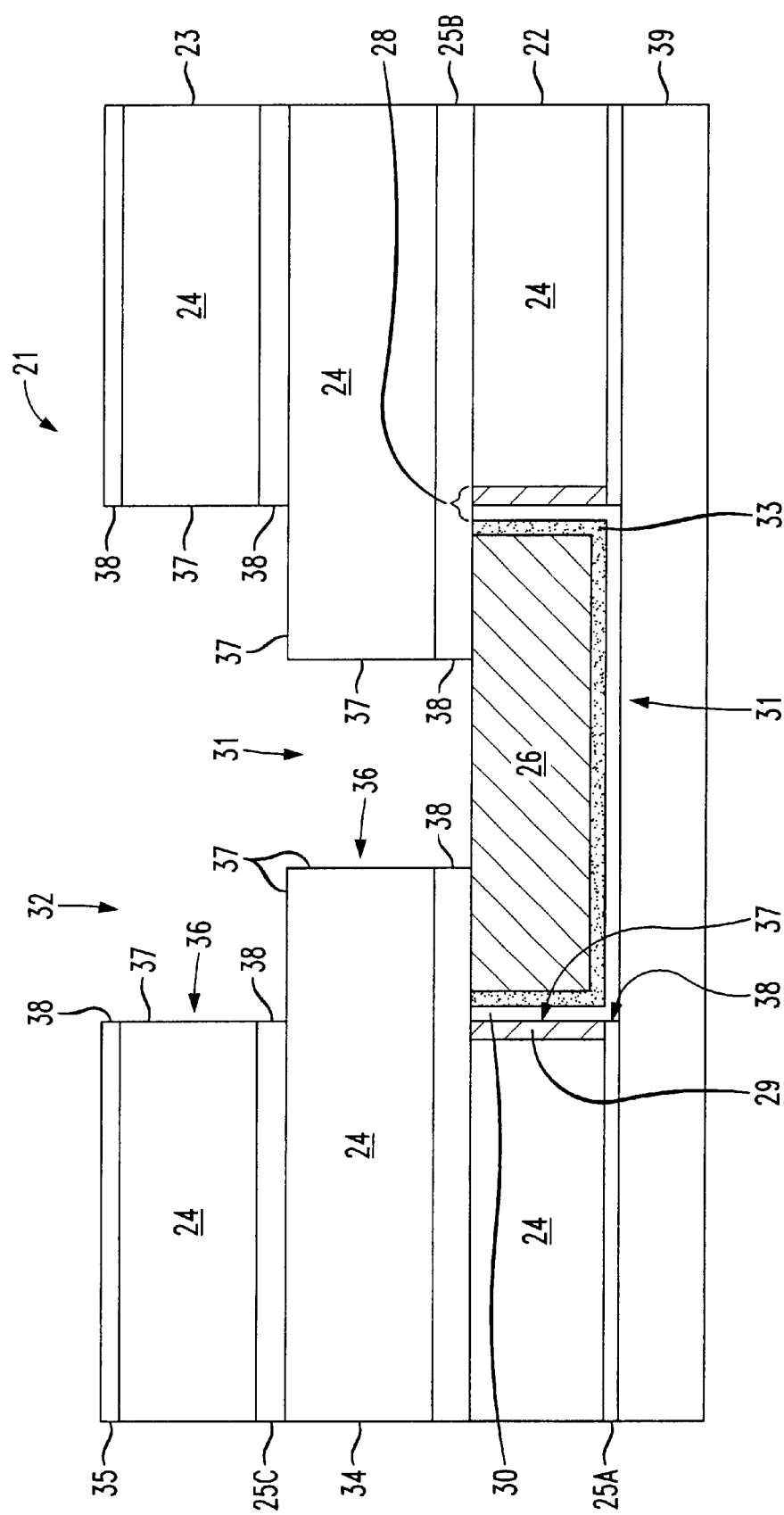
FIG. 2 is a partial sectional view of a step in the fabrication of an interconnect structure utilizing the novel barrier layer in a metal layer, and a via and trench have been etched above the metal layer.

With respect to FIG. 2, a step in the fabrication of an interconnect structure 21 is shown in which a lower metal layer 22 has been completed. The lower metal layer 22 includes a dielectric material 24 deposited over a semiconductor substrate 39. A first etch stop layer 25A is interposed between the device substrate 35 and the lower metal layer 22.

The etch stop layer 25A is composed of dielectric materials typically used in the fabrication of interconnect structures, and known to those skilled in the art, and may include silicon carbide, silicon nitride, silicon dioxide and/or combinations thereof. The dielectric material may include spin-on low-k dielectrics such as organosilicate glass, having a dielectric constant of up to about 4.0. Some such dielectrics include CORAL and BLACK DIAMOND manufactured and sold by Novellus, Inc. However, the dielectric material is not limited to a low-k dielectric Two dielectric layers are deposited over the lower metal layer 22, in the form of an insulating layer 34 and upper metal layer 23. A second etch stop layer 25B, is first deposited over the lower metal layer 22, and then the insulating layer 34 is deposited over the etch stop layer 25B and lower metal layer 22. A third etch stop layer 25C is then deposited over the insulating layer 34, and the upper metal layer 23 is deposited over the third etch stop layer 25C.

A device barrier 35 is then formed over the upper metal layer 23. The device barrier layer 35 is usually a film remnant of a mask layer deposited over the device for purposes of patterning and etching device features such as vias or trenches. With respect to FIG. 2, a via 31 has been etched in the insulating layer 34, and a trench 32 has been etched into the upper metal layer 23. Dual damascene processes, known to those skilled in the art may be used to form the device features 31 and 32.

The etch stop layer 25B and 25C, and the device barrier layer 35, are composed of dielectric materials typically used in the fabrication of interconnect structures, and known to those skilled in the art, and may include silicon carbide, silicon nitride, silicon dioxide and/or combinations thereof. The insulating layer 34 and the upper metal layer 23 may be comprised of the dielectric material 24.

As shown in FIG. 2, the lower metal layer includes a line 26 formed within the dielectric material 24. The lower metal layer 22 is fabricated using a single damascene process, which includes etching a trench feature 31 into the low-k dielectric material, forming a barrier layer 28 within the trench 31, then depositing a seed layer 33 over the barrier layer 28, and then a conductive metal, such as copper, over the seed layer 33 to form the line 26. The etch stop layer 25B is then deposited over the metal layer 22.

Figure 3:
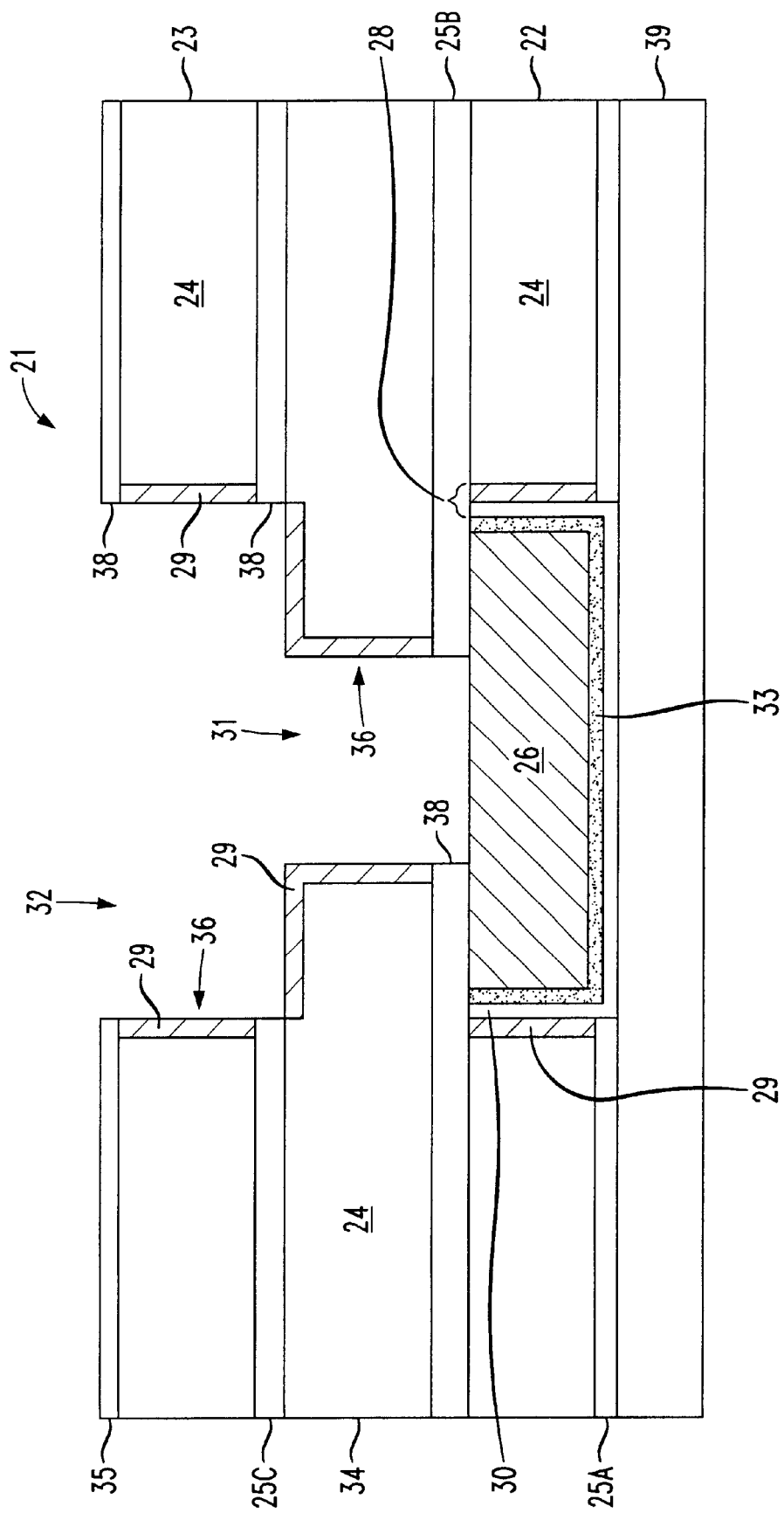
FIG. 3 is a partial sectional view of a step in the fabrication of an interconnect structure in which a $Si_3N_4$ film has been formed in the via and trench.
Figure 4:
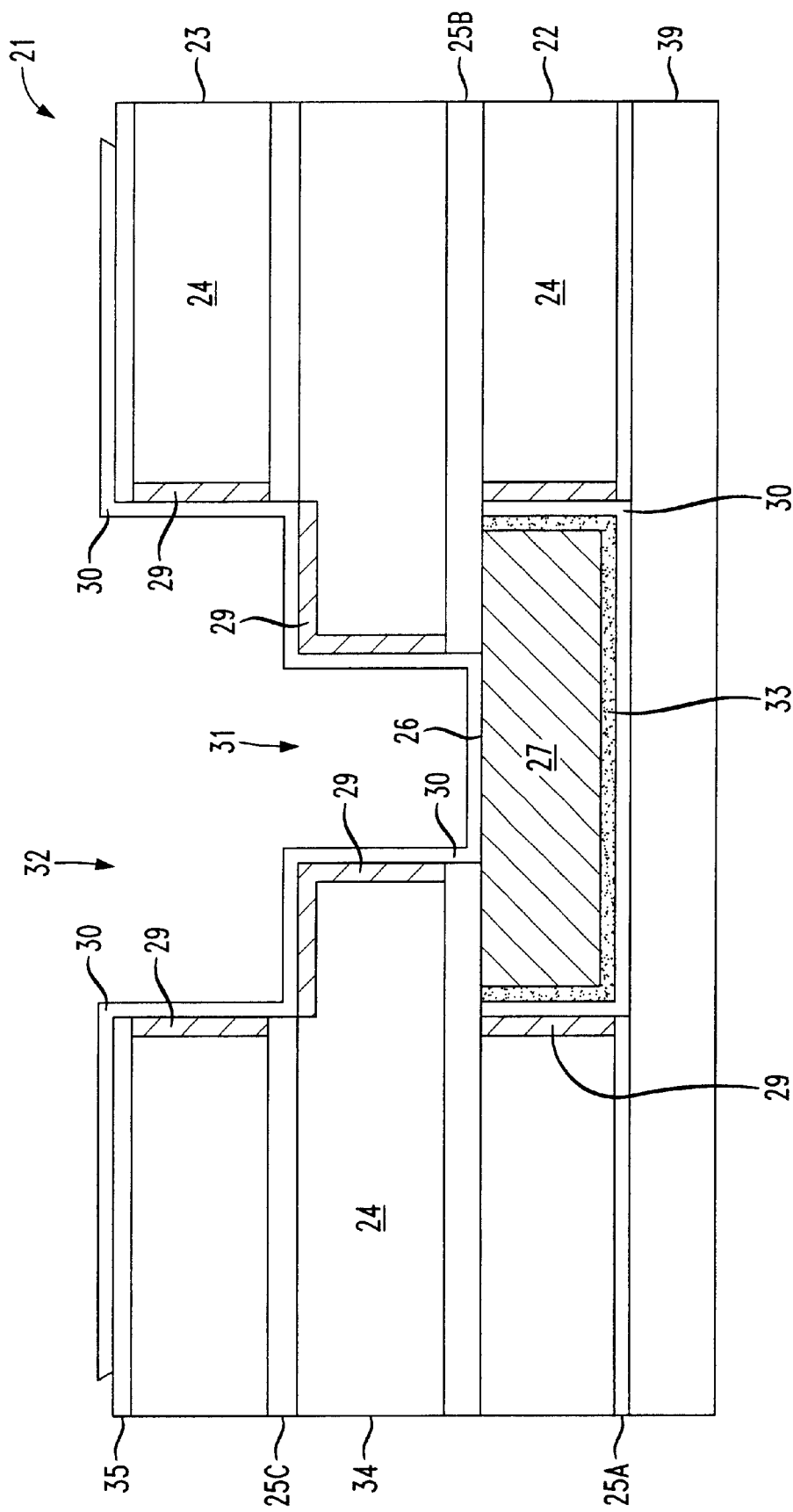
FIG. 4 is a partial sectional view of a step in the fabrication of an interconnect structure, in which a refractory metal film has been deposited in the via and trench.
Figure 5:
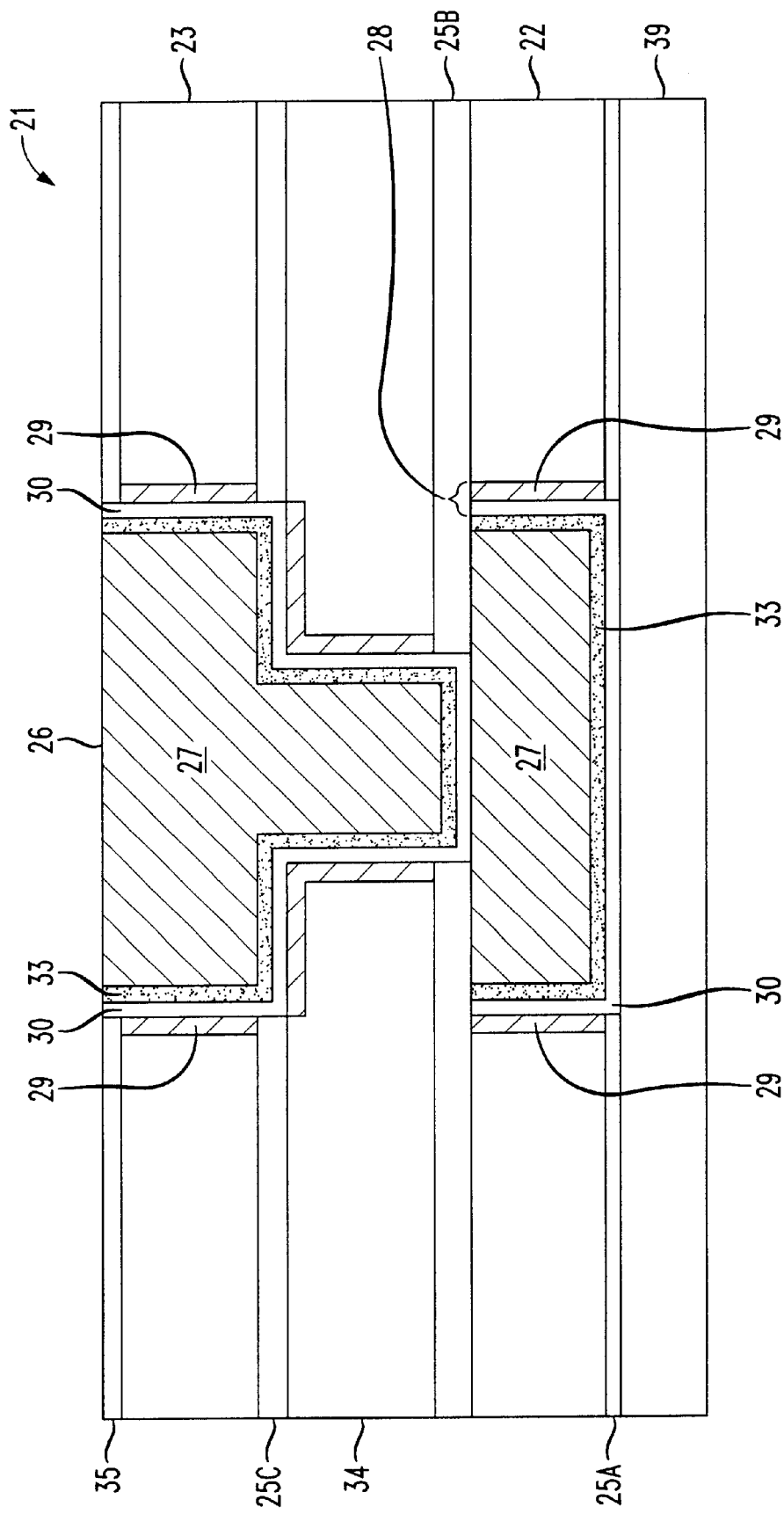
FIG. 5 is a partial sectional view of a step in the fabrication of an interconnect structure in which a refractory metal film and a conductive metal have been deposited in the via and trench.

With respect to FIGS. 3 through 5, after fabrication of the lower metal layer is completed, and the via 31 and trench 32 are etched in the layers 34 and 23 respectively, the barrier layer 28 is formed within the features 31 and 32, then the seed layer 33 is deposited over the barrier layer 28. A conductive metal is then deposited or grown within the features 31 and 32, and over the line 26 and the seed layer 33. The metal 27, barrier layer 28 and seed layer 33 are then planarized using CMP, to remove excess metal and film materials deposited on the device outside the features 31 and 32.

The barrier layer 28, formed within features in the lower metal layer 22 and upper metal layer 23, includes a first film 29 composed of silicon nitride ($Si_3N_4$) disposed along the surface of the dielectric material 24 within the features 31 and 32. The barrier layer 28 also includes a second film 30, composed of a refractory metal and/or a refractory metal alloy deposited over the first film 29.

With respect to FIGS. 2 and 3, the features 31 and 32 include sidewalls 36 formed by the exposed surfaces 37 and 38 of the dielectric material 24 and etch stop layers 25A, 25B and 25C, respectively. The via 31 also includes a bottom formed by an top surface of the line 26. The trench 32 in the lower metal layer also includes a bottom disposed over the substrate 39. The first film 29 is disposed along the dielectric surfaces 37 only, and the second film 30 covers the sidewalls 36 including the dielectric surfaces 37 and etch-stop surfaces 38.

The first film 29 is formed by exposing the dielectric surfaces 37 within the features 31 and 32 to nitrogen at a predetermined temperature and pressure, for a timed duration. The dielectric surfaces 37 undergo a chemical reaction known as nitridation, which forms a chemical bond between the silicon of the dielectric material 24, and nitrogen introduced under controlled parameters.

The nitridation may be conducted in a tool in which a plasma can be generated, such as a plasma etching or plasma enhanced deposition tool. For example, the nitridation may be performed in a microwave plasma, a physical vapor deposition tool having an rf-power bias, or a plasma-enhanced chemical vapor deposition (PECVD) tool. Each of these tools is used in the fabrication of semiconductor devices and their operations are known to those skilled in the art, who will appreciate that the chosen tool may be readily adapted to receive nitrogen injected into chamber in which a plasma has been generated. One such tool includes the IRIDIA-DL microwave tool manufactured by Novellus, Inc.

After features 31 and 32 are etched into the dielectric material 24, and the device is cleaned for subsequent fabrication steps, the device is fixed to a platen in a microwave reaction chamber. When the IRIDIA-DL microwave is used, nitrogen, either in the form of pure nitrogen ($N_2$), or ammonia ($NH_3$), is purged through the chamber at a rate of about 500 sccm for the IRIDIA microwave. The temperature of the chamber is elevated to about 270° C., for about 120 seconds, at a pressure of about 600 mtorr and with the microwave power set at approximately 1700 watts.

When nitrogen is purged through the microwave reaction chamber, the plasma generates nitrogen ions and/or free radicals, which bombard and react with the silicon in the dielectric surface forming a $Si_3N_4$ film. The first film actually penetrates the dielectric surface to a depth of approximately 50° A., and may react with the silicon to a depth of up to about 100° A. Typically the depth of the silicon nitride film 29 will range from about 15° A. to about 50° A. within the dielectric material 24. The nitrogen does not react with exposed surfaces of the etch stop layers 25A–C, device barrier 35, or conductive metal forming a plurality of the film sections of the first film 29 within the features 31 and 32.

After the silicon nitride film is formed on the dielectric surfaces, the second film 30 is deposited within features 31 and/or 32. The second film 30 (also referred to as refractory metal film) is composed of a refractory metal or refractory metal alloy. A common metal used to form a barrier layer includes tantalum (Ta) or tantalum nitride; however, other refractory metals are acceptable including tungsten, tungsten nitride, titanium and/or titanium nitride. The refractory metal film is applied using known deposition processes such as sputter deposition, or chemical vapor deposition, by which the metal film 30 conforms to the shape of the sidewalls 36 of the features 31 and 32 and covers the silicon nitride films 29. As shown in FIGS. 4 and 5, the refractory metal film conforms to the shape of the via 31, and covers the conductive line 26. As a result of the formation of silicon nitride film 29, the thickness of the refractory metal film 30 can be reduced appreciably, decreasing the contact resistance between the film 30 and the line 26. The refractory metal film 30 ranges in thickness from about 150 A to about 500 A. The film 30 can now be reduced to about half the typical thickness.

A seed layer 33 is then deposited over the refractory film 30 so the conductive metal layer will adhere to the sidewalls 36 of the features 31 and 32. The copper or conductive metal 27 is then deposited in the via and trench features 31 and 32, and the device is planarized. The completed interconnect structure is shown in FIG. 5, and includes the lines 27 in the upper metal layer 23 and the lower metal layer 22 interconnected by the metal filled via 31. Each of the trench features 32 and the via 31 are lined with the novel barrier layer including the first film or silicon nitride film 29 disposed along the surface of the dielectric material 24 within the features 31 and 32, and the refractory metal film 30 deposited over the silicon nitride film 29.

While the preferred embodiments of the present invention have been shown and described herein in the present context, it will be obvious that such embodiments are provided by way of example only and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

We claim as our invention:

1. A semiconductor device, comprising:
   (a) a dielectric material having at least two layers and an etch stop layer interposed between the two layers of dielectric material and a recess is formed in the two layers of the dielectric material and the etch stop layer, forming a plurality of surfaces of the dielectric material within the recess that are spaced apart by the etch stop layer;
   (b) a silicon nitride film disposed along each surface of the dielectric material within the recess in the dielectric material but not along the surface of the etch stop layer within the recess; and
   (c) a refractory metal film overlaying the silicon nitride film.

2. The semiconductor device of claim 1 in which the silicon nitride film is formed from a process in which the dielectric material comprises silicon and is exposed to a nitrogen-containing material converting the chemical composition of at least a portion of the dielectric material adjacent to the recess to silicon nitride.

3. The semiconductor device of claim 2 in which the dielectric material is exposed to the nitrogen source at a predetermined temperature and pressure, for a timed duration.

4. The semiconductor device of claim 1 wherein said refractory metal film is conformally deposited within the recess, over the silicon nitride film and surfaces of the etch stop layer.

5. The semiconductor device of claim 1 wherein said recess is a trench formed in the dielectric material.

6. The semiconductor device of claim 1 wherein said feature includes a via and a trench formed in the dielectric material.

7. The semiconductor device of claim 1 wherein said recess includes a via formed in the dielectric material.

8. A semiconductor device, comprising:
   (a) two metal layers separated by an insulating layer;
   (b) a recess formed in the two metal layers and insulating layer, and exposing a surface of at least one dielectric material within the recess;
   (c) a conductive metal deposited within, and filling said recess;
   (d) a barrier layer formed in the recess between the dielectric material and the conductive metal, having a silicon nitride film disposed along the surface of the dielectric material and a refractory metal layer between the silicon nitride film and the conductive metal; and,
   (e) said refractory metal layer interposed between the conductive metal in the recess in one of the metal layers and the insulating layer.

9. The semiconductor device of claim 8 wherein said at least one dielectric material comprises a low-k dielectric material.

10. The semiconductor device of claim 8 further comprising two etch stop layers, and each etch stop layer is interposed between the insulating layer and a respective metal layer, and said recess having a plurality of surfaces of the dielectric material therein spaced apart by a surface of the etch stop layer, and said silicon nitride film is disposed along the surface of the dielectric material, but not along etch stop layer surface.

11. The semiconductor device of claim 8 wherein in said recess comprises a trench formed in each of the two metal layers, and a via formed in the insulating layer interconnecting the trenches of the metal layers.

12. A dual damascene process for the fabrication of a semiconductor device, comprising the steps of:
   (a) forming a recess within a dielectric material, the recess having a via connected to a trench;
   (b) forming a silicon nitride film within a recess formed within a dielectric material along a surface of the dielectric material within the via and within the trench; and, (c) forming a refractory metal film over the silicon nitride films within the recess formed in the dielectric material.

13. The process of claim 12 wherein said step of forming the silicon nitride film comprises converting the chemical composition of at least a portion of the dielectric material adjacent to the recess to silicon nitride by exposing the surface of the dielectric material to a nitrogen-containing material.

14. The process of claim 13 wherein the dielectric material is exposed to the nitrogen-containing material at a predetermined temperature and pressure, for a timed duration.

15. The process of claim 13 wherein said step of converting the chemical composition of the dielectric material comprises providing a deposition chamber in which the semiconductor device is fixed, generating a plasma within the reaction chamber adjacent to the semiconductor device and injecting nitrogen into the reaction chamber and plasma.

16. The process of claim 13 wherein the step of converting the chemical composition of the dielectric material further comprises elevating a temperature within the reaction chamber within the range of about 250° C. to about 270°, maintaining the pressure within the chamber within the range of about 400 mtorr to about 1000 mtorr, and maintaining said temperature and pressure for about 120 seconds.

17. The process of claim 12 further comprising the step of forming at least one etch stop layer on the semiconductor adjacent the dielectric layer and said step of forming the recess includes forming the recess in said etch stop layer and dielectric layer whereby the sidewall of the recess includes a surface of the etch stop layer and the surface of the dielectric material.

18. The process of claim 17 wherein the step of forming a silicon nitride film comprises forming said silicon nitride film along the surface of the dielectric material within the recess, and not along the surface of the etch stop layer within the recess.

19. The process of claim 12 wherein the step of forming the refractory metal film includes depositing the refractory metal film over the silicon nitride film and the surface of the etch stop layer.

* * * * *